(12) United States Patent
Jang et al.

(10) Patent No.: US 8,728,331 B2
(45) Date of Patent: May 20, 2014

(54) METHODS OF FABRICATING IMPRINT MOLD AND OF FORMING PATTERN USING THE IMPRINT MOLD

(75) Inventors: Doo Hee Jang, Gyeonggi-do (KR); Dhang Kwon, Daejeon (KR); Hang Sup Cho, Gyeonggi-do (KR); Ho Su Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/961,983

(22) Filed: Dec. 7, 2010

(65) Prior Publication Data

US 2011/0140303 A1    Jun. 16, 2011

(30) Foreign Application Priority Data

Dec. 11, 2009    (KR) .................. 10-2009-0123605

(51) Int. Cl.
*C03C 15/00*    (2006.01)

(52) U.S. Cl.
USPC .................. 216/11; 216/40; 216/41; 216/47; 216/49; 216/97

(58) Field of Classification Search
None
See application file for complete search history.

(56) References Cited

U.S. PATENT DOCUMENTS

| 5,246,531 | A  | * | 9/1993 | Junji et al. ................. 216/47 |
| 5,906,911 | A  | * | 5/1999 | Cote ........................... 430/316 |
| 6,749,997 | B2 | * | 6/2004 | Morales et al. ............. 430/323 |
| 2005/0202350 | A1 | * | 9/2005 | Colburn et al. ............. 430/320 |
| 2008/0067603 | A1 | * | 3/2008 | Choung et al. ............. 257/365 |
| 2009/0218571 | A1 | * | 9/2009 | Chen et al. .................. 257/59 |

FOREIGN PATENT DOCUMENTS

| CN | 101409262 A |   | 4/2009 |
| WO | WO 03073421 A1 | * | 9/2003 |
| WO | 2007/030527 A |   | 3/2007 |

OTHER PUBLICATIONS

English machine translation of CN 101409262 B, published Jun. 9, 2010, "Pixel Structure Manufacturing Method" Chuanghwa Picture Tubes Ltd.*
Translation of Chinese Office Action dated Feb. 17, 2012, in counterpart Chinese Office Action.

* cited by examiner

*Primary Examiner* — Anita Alanko
(74) *Attorney, Agent, or Firm* — Morgan, Lewis & Bockius LLP

(57) ABSTRACT

A method of fabricating an imprint mold is disclosed. The method includes: forming a first photo resist pattern on a substrate; etching the substrate using the first photo resist pattern as an etch mask to form a first pattern in the substrate; ashing the first photo resist pattern to form a second photo resist pattern; and etching the substrate using the second photo resist pattern to form a second pattern derived from the substrate and a third pattern derived from the first pattern.

4 Claims, 9 Drawing Sheets

METHODS OF FABRICATING IMPRINT MOLD AND OF FORMING PATTERN USING THE IMPRINT MOLD

CROSS-REFERENCE TO RELATED APPLICATION

This application claims priority under 35 U.S.C. 119 to Korean Patent Application No. 10-2009-0123605, filed on Dec. 11, 2009 which is hereby incorporated by reference in its entirety.

BACKGROUND

1. Field of the Disclosure

This disclosure relates to a method of fabricating an imprint mold and a method of forming a pattern using the imprint mold.

2. Description of the Related Art

Liquid crystal display (LCD) devices are classified into a display device configured to drive a switch element, such as a thin film transistor, which is included in each pixel. The pixels within such an LCD device have a size of several decade micrometers. Such a pixel can be formed by performing several times a fine pattern formation process.

The fine pattern is ordinarily formed using lithography which is necessary to employ equipment. The finer the pattern is, the more the equipment employed in lithography becomes expensive. As such, a variety of techniques adapted to form the fine pattern at low cost are currently being researched.

Actually, the LCD device is fabricated by forming a variety of fine patterns which are used as functional films (or layers) such as electrodes, barriers, insulation films, and so on. As such, the fine pattern formation techniques of the low cost are being developed and applied to the fabrication of the LCD device. The fine pattern formation techniques of the low cost include an imprint method.

FIGS. 1A through 1C are cross-sectional views illustrating an imprint method of the related art which is used in the formation of a fine pattern.

As shown in FIG. 1A, a substrate 11 is covered with a resist film 12. Also, a mold 10 provided with a fine pattern 10a of an intaglio shape is positioned above the resist film 12.

Subsequently, the resist film 12 is depressed by the mold 10, as shown in FIG. 1B. At this time, the fine pattern 10a is transcribed onto the resist film 12 which is depressed by the mold 10.

Thereafter, the mold 10 is lifted up and separated from the resist film 12. As a result, a fine pattern 12a with a land shape is formed on the resist film 12.

The fine pattern 10a on the mold 10 used in the imprint method as described above is formed through photographing and etching processes using a photo resist. Such a fine pattern 10a can be used only to form a pattern of single layer structure.

Meanwhile, the LCD device is configured to include a pattern of multi-layer structure. A plurality of molds each having a pattern of single layer structure is sequentially used to form the pattern of multi-layer structure. As such, the manufacturing processes of the LCD device increases and the manufacturing cost of the LCD device becomes higher. Therefore, a new imprint mold adapted to form a pattern of multi-layer structure in the LCD device is required.

BRIEF SUMMARY

Accordingly, the present embodiments are directed to a method of fabricating an imprint mold that substantially obviates one or more of problems due to the limitations and disadvantages of the related art, and a pattern formation method using the imprint mold.

An object of the present embodiment is to provide a method of fabricating an imprint mold which is suitable for forming a fine pattern of multi-layer structure, and a method of forming a pattern using the imprint mold.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to one general aspect of the present embodiment, a method of fabricating an imprint mold includes: forming a first photo resist pattern on a substrate; etching the substrate using the first photo resist pattern as an etch mask to form a first pattern in the substrate; ashing the first photo resist pattern to form a second photo resist pattern; and etching the substrate using the second photo resist pattern to form a second pattern derived from the substrate and a third pattern derived from the first pattern.

The second pattern is formed to have a first depth, and the third pattern is formed to have a deeper depth than that of the first pattern.

The first photo resist pattern is formed to include two different step heights using a mask with three different transmittances from one another.

The method according to one general aspect of the present embodiment further includes forming a metal film between the substrate and the first photo resist pattern.

The etching processes using the first and second photo resist patterns are performed in a wet etching method.

A fabricating method of an imprint mold according to another aspect of the present embodiment includes: forming a metal film on a substrate; forming first and second photo resist patterns on the metal film; etching the metal film and the substrate using the first and second photo resist patterns to form first and second metal patterns and a first pattern; removing the second photo resist pattern and the second metal pattern; and etching the substrate using the first photo resist pattern as an etch mask to form a second pattern derived from the substrate and a third pattern derived from the first pattern.

The second pattern is formed to have a first depth and the third pattern is formed to have a deeper depth than that of the first pattern.

The second photo resist pattern and the second metal pattern are formed to a narrower width than that of the first photo resist pattern.

The removal of the second photo resist pattern and second metal pattern is performed by a wet etching process.

The etching processes using the first and second photo resist patterns are performed in a wet etching method.

A fine pattern formation method using an imprint mold according to still another aspect of the present embodiment includes: preparing a substrate covered with a film to be patterned; aligning the imprint mold provided with first and second patterns above the substrate; bring the imprint mold in contact with the pattern formation film to transcribe the patterns of the imprint mold into the pattern formation film; hardening the pattern formation film into which the patterns of the imprint mold are transcribed; and separating the imprint mold from the pattern formation film provided with the patterns.

The first pattern is formed to have a first depth and the second pattern is formed to have a deeper depth than that of the first pattern.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1A:
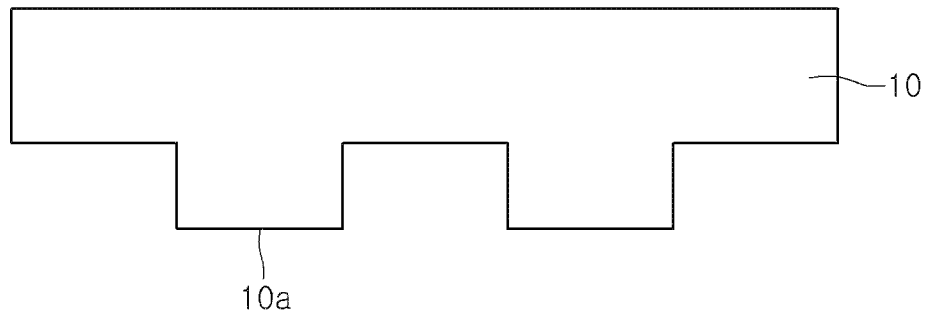
FIGS. 1A through 1C are cross-sectional views illustrating an imprint method of related art which is used in the formation of a fine pattern.
Figure 1A:
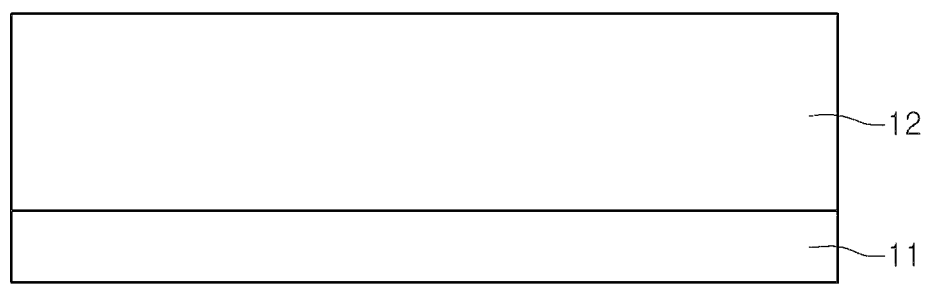
Figure 1B:
Figure 1B:
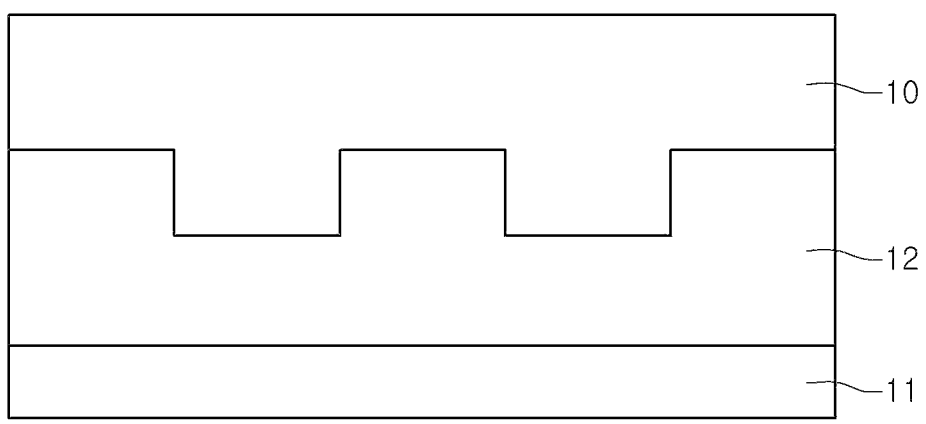
Figure 1C:
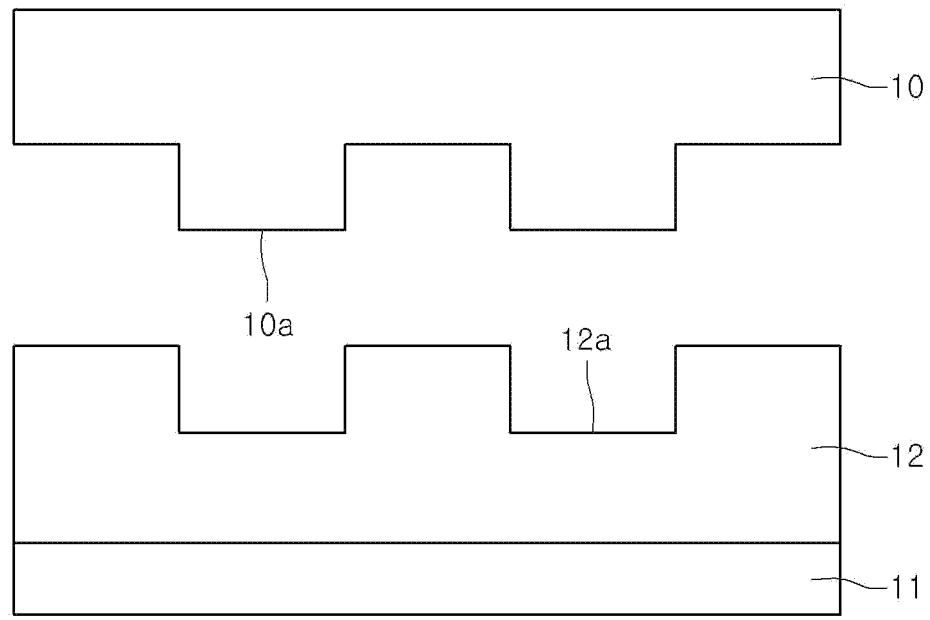

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts. Furthermore, it will be understood that when an element, such as a substrate, a layer, a region, a film, or an electrode, is referred to as being formed "on" or "under" another element in the embodiments, it may be directly on or under the other element, or intervening elements (indirectly) may be present. The term "on" or "under" of an element will be determined based on the drawings. In the drawings, the sides of elements can be exaggerated for clarity, but they do not mean the practical sizes of elements.

Imprint mold fabrication methods and a pattern formation method using an imprint mold according to embodiments of the present disclosure will now be described in detail with reference to the attached drawings. First, the descriptions of imprint mold fabrication methods according to this disclosure will be made.

Figure 2A:
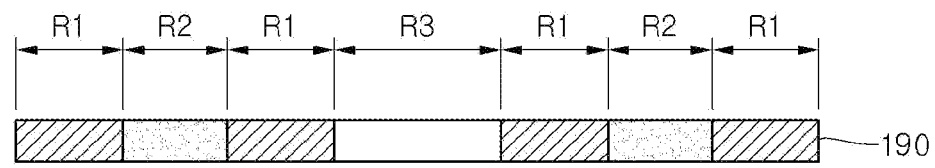
FIGS. 2A through 2E are cross-sectional views sequentially illustrating a method of fabricating an imprint mold according to a first embodiment of the present disclosure.
Figure 2A:
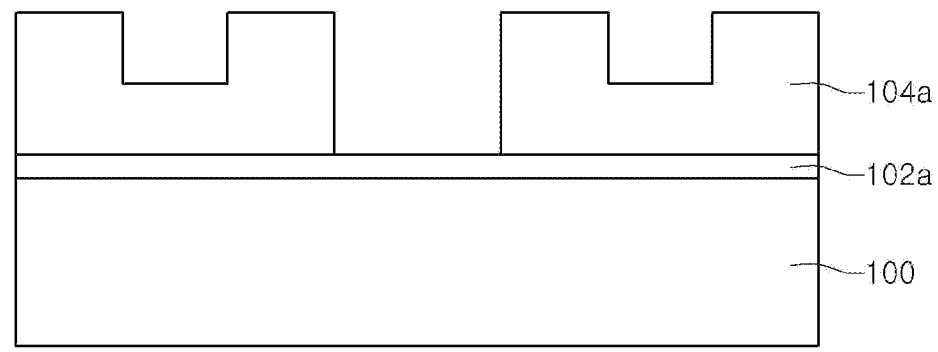

FIGS. 2A through 2E are cross-sectional views sequentially illustrating a method of fabricating an imprint mold according to a first embodiment of the present disclosure;

As shown in FIG. 2A, a metal film 102a and a first photo resist pattern 104a are sequentially formed on a glass substrate 100. The first photo resist pattern 104a is provided by coating a photo resist on the metal film 102a and then photographing the photo resist using a mask 190. In this case, the mask 190 includes a transmission region R3 formed to transmit light, semi-transmission regions R2 formed to transmit a part of light, and opaque regions R1 formed to shield light. In other words, the mask 190 is formed to have three different transmittances according to the regions. More specifically, the semi-transmission region R2 has a higher transmittance than that of the opaque region R1. As such, portions of the first photo resist pattern 104a corresponding to the semi-transmission regions R2 become thinner than other portions corresponding to the opaque regions R1. Consequently, the first photo resist pattern 104a is formed to have two different step heights.

Figure 2B:
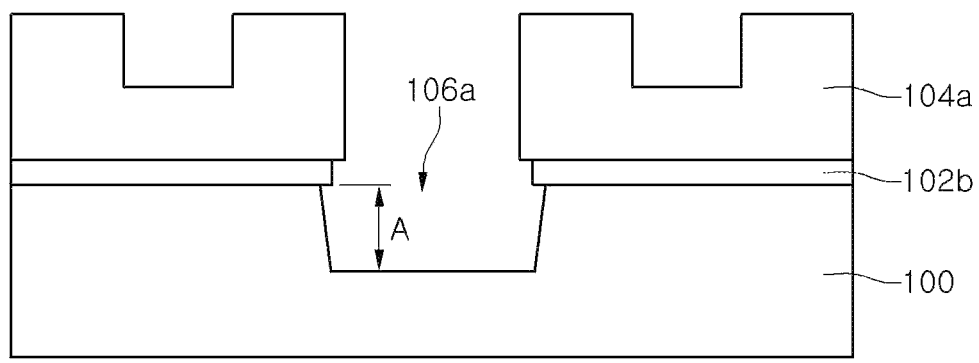

Then, the metal film 102a and the glass substrate 100 are sequentially etched using the first photo resist pattern 104a as an etch mask, thereby forming a first intaglio pattern 106a of a first depth A in the glass substrate 100 and a first metal pattern 102b, as shown in FIG. 2B. The first intaglio pattern 106a of the first depth A is formed by performing a wet etching process.

Figure 2C:
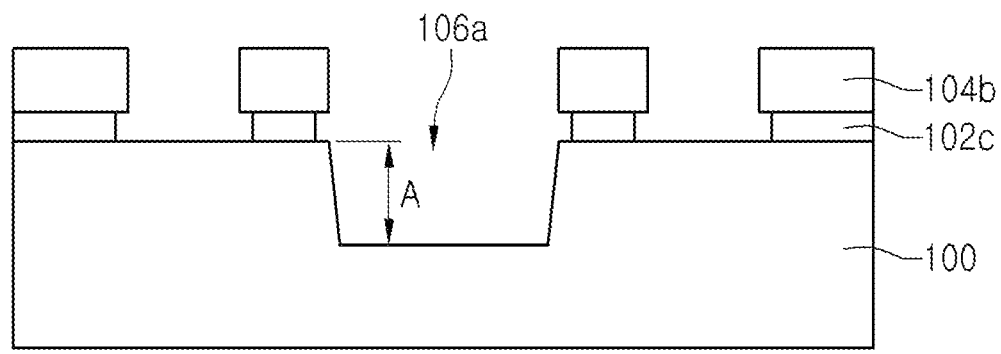

Subsequently, a second photo resist pattern 104b configured to partially expose the first metal pattern 102b is formed by ashing the first photo resist pattern 104a until the surface of the first metal pattern 102b is exposed, as shown in FIG. 2C. Also, the portions of the first metal pattern 102b exposed through the second photo resist pattern 104b is wet-etched to form a second metal pattern 102c. The second metal pattern 102c formed through the wet etching processing partially exposes the glass substrate 100.

Figure 2D:
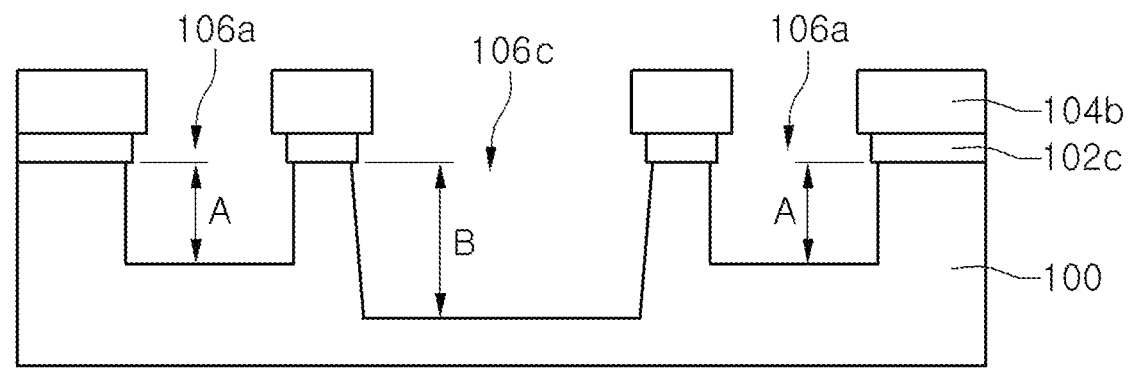

Afterward, as shown in FIG. 2D, the glass substrate 100 and the first intaglio pattern 106a of the first depth A are etched using the second metal pattern 102c and second photo resist pattern 104b as an etch mask, so as to form a second intaglio pattern 106c of a second depth B and third intaglio patterns 106a of the first depth A. The second intaglio pattern 106c of the second depth B is formed by etching one more the first intaglio pattern 106a of the first depth A. As such, the second intaglio pattern 106c is deeper than the third intaglio patterns 106a of the first depth A. The third intaglio patterns 106a of the first depth A are formed by etching the exposed surface portions of the glass substrate 100. The second intaglio pattern 106c of the second depth B and the third intaglio patterns 106a of the first depth A are formed by performing a wet etching process.

Figure 2E:
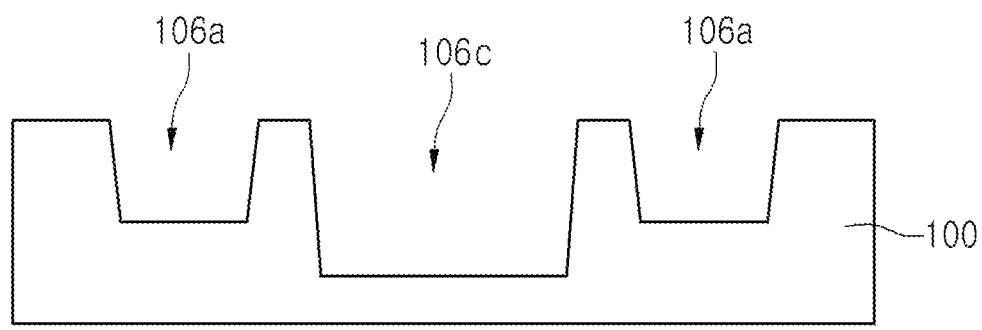

Next, the second photo resist pattern 104b and the second metal pattern 102c on the glass substrate 100 provided with the second and third intaglio patterns 106c and 106a of the second and first depths B and A are removed through a stripping process and an etching process, as shown in FIG. 2E. As a result, the glass substrate 100 with the second and third intaglio patterns 106c and 106a of the second and first depths B and A is formed in a structure suitable to use as an imprint mold.

Such a glass substrate 100 with the third and second intaglio patterns 106a and 106c of the first and second depths A and B is used for forming a fine pattern of multi-layer structure. As such, the glass substrate 100 can prevent the sequential use of several molds each having a pattern of single layer structure. Accordingly, the glass substrate 100 with the third and second intaglio patterns 106a and 106c of the first and second depths A and B can reduce the number of processes and the costs necessary to form a fine pattern of multi-layer structure.

FIGS. 3A through 3E are cross-sectional views sequentially illustrating a method of fabricating an imprint mold according to a second embodiment of the present disclosure.

Figure 3A:
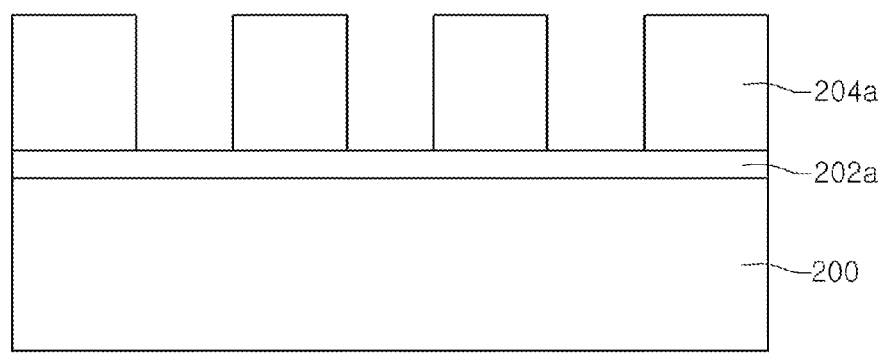
FIGS. 3A through 3E are cross-sectional views sequentially illustrating a method of fabricating an imprint mold according to a second embodiment of the present disclosure.

As shown in FIG. 3A, a metal film 202a and a photo resist pattern layer are sequentially formed on a glass substrate 200. The photo resist pattern layer includes first and second photo resist patterns 204a and 204b. The first and second photo resist patterns 204a and 204b are formed by coating a photo resist on the metal film 202a and then photographing the photo resist using a mask. In this case, the second photo resist pattern 204b is formed in a narrower width than that of the first photo resist pattern 204a.

Figure 3B:
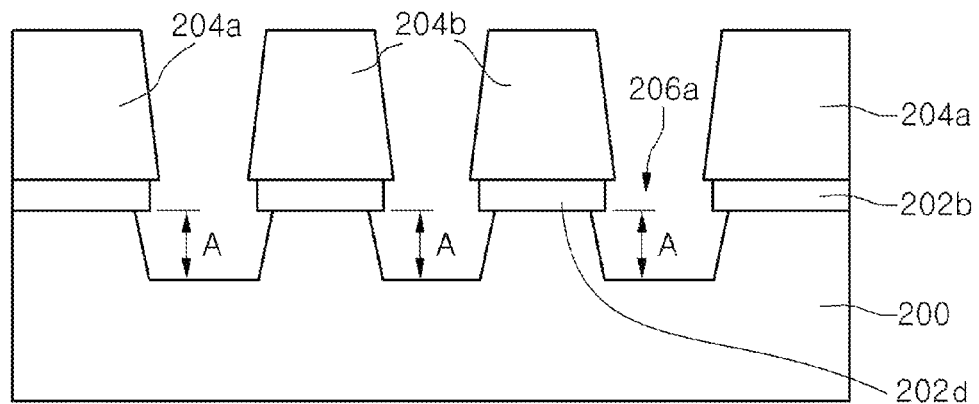

Then, the metal film 202a and the surface layer of the glass substrate 200 are etched using the first and second photo resist patterns 204a and 204b as an etch mask, thereby forming a first intaglio pattern 206a of a first depth A in the glass substrate 200 and first and second metal patterns 202b and 202d, as shown in FIG. 3B. The first intaglio pattern 206a of the first depth A is formed by performing a wet etching process. The second metal pattern 202d covered with the second photo resist pattern 204b is formed in a narrower width than that of the first metal pattern 202b disposed under the first photo resist pattern 204a. This results from the fact that the second photo resist pattern 204b is narrower than the first photo resist pattern 204a.

Figure 3C:
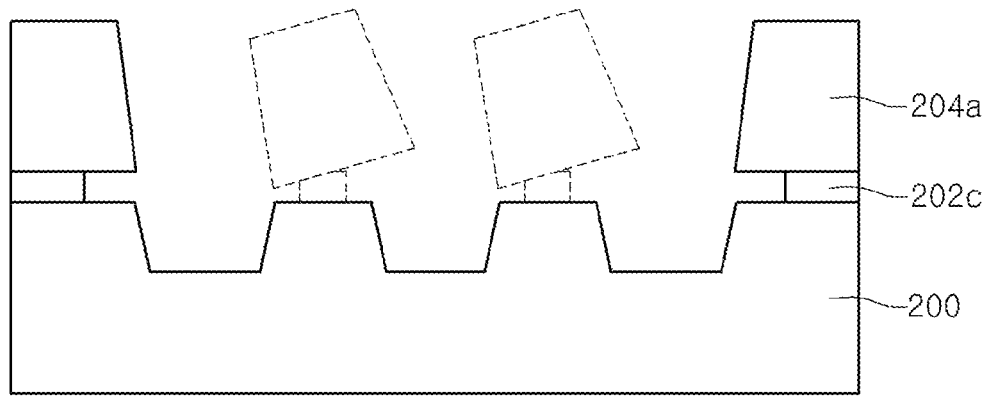

Furthermore, the first and second metal pattern 202b and 202d are wet-etched using the first and second photo resist patterns 204a and 204b as an etch mask, thereby forming a third metal pattern 202c, as shown in FIG. 3C. This wet etching process is performed until the second metal pattern 202d is entirely removed. As the second metal pattern 202d is entirely removed, the second photo resist pattern 204b, which had been disposed on the second metal pattern 202d, is lifted off. This results from that the wet etching process has an isotropic etch characteristic. More specifically, since the first and second metal pattern 202b and 202d are simultaneously etched through the wet etching process, the second metal pattern 202d is entirely removed and a part of the first metal pattern 202b remains. The remained portion of the first metal pattern 202b is used as a third metal pattern 202c. Consequently, the third metal pattern 202c and the first resist pattern 204a remain on the glass substrate 100.

Figure 3D:
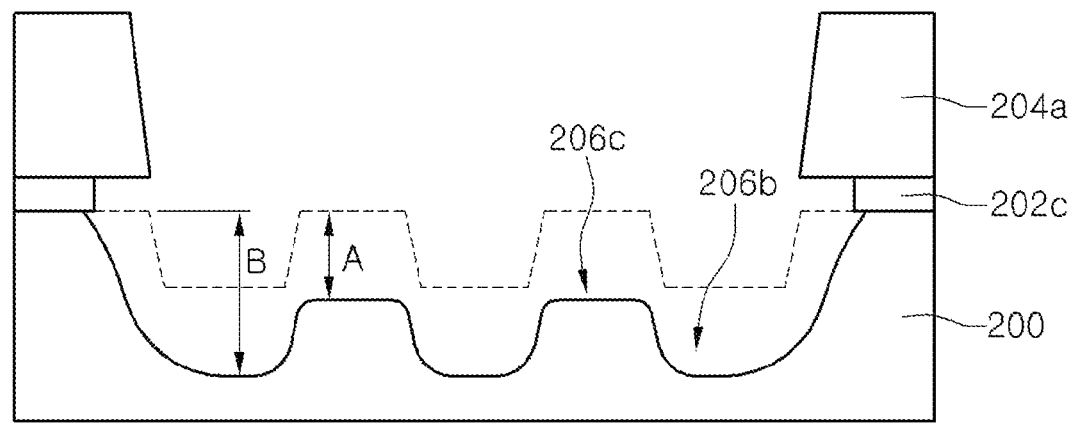

Subsequently, as shown in FIG. 3D, the glass substrate 200 and the first intaglio pattern 206a of the first depth A are etched using the third metal pattern 202c and the first photo resist pattern 204a as an etch mask, so as to form a second intaglio pattern 206b of the second depth B and a third intaglio pattern 206c of a second depth A. The second intaglio pattern 206b of the second depth B is deeper than the third intaglio pattern 206c of the first depth A because it is formed by etching one more the first intaglio pattern 206a of the first depth A. The third intaglio pattern 206c of the first depth A is formed by etching the exposed surface portion of the glass substrate 200. The third and second intaglio patterns 206c and 2006b with the first and second depths A and B are formed by performing a wet etching process. Also, the residual of the second metal pattern 202c is removed when the first photo resist pattern 204a is etched.

Figure 3E:
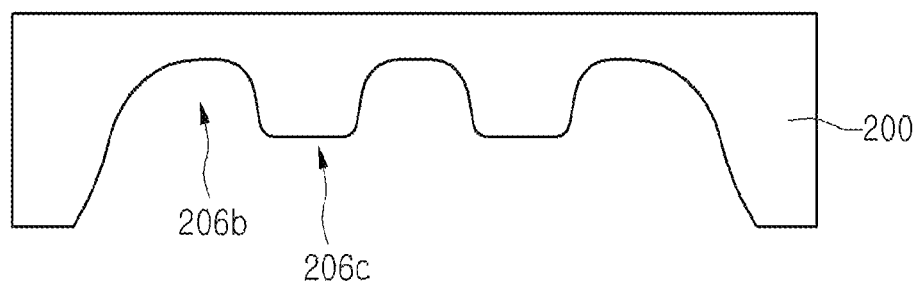

Thereafter, the first photo resist pattern 204a and third metal pattern 202c on the glass substrate 200 provided with the third and second intaglio patterns 206c and 206b of the first and second depths A and B are removed through a stripping process and an etching process, as shown in FIG. 3E. As a result, the glass substrate 200, which is used as an imprint mold, with the third and second intaglio patterns 206c and 206b of the first and second depths A and B is obtained.

Such a glass substrate 200 with the third and second intaglio patterns 206c and 206b of the first and second depths A and B is used for forming a fine pattern of multi-layer structure. As such, the glass substrate 200 can prevent the sequential use of several molds each having a pattern of single layer structure. Accordingly, the glass substrate 200 with the third and second intaglio patterns 206c and 206b of the first and second depths A and B can reduce the number of processes and the costs necessary to form a fine pattern of multi-layer structure.

A pattern formation method using the imprint mold 100 or 200, which is provided through the fabricating method as described above, will be now explained. For the convenience of explanation, a method of forming a pattern of multi-layer structure using the imprint mold 100 which is provided through the imprint mold fabrication method of the first embodiment will be described. Alternatively, the method can form a pattern of multi-layer structure using the imprint mold 200 which is provided through the imprint mold fabrication method of the second embodiment.

Figure 4A:
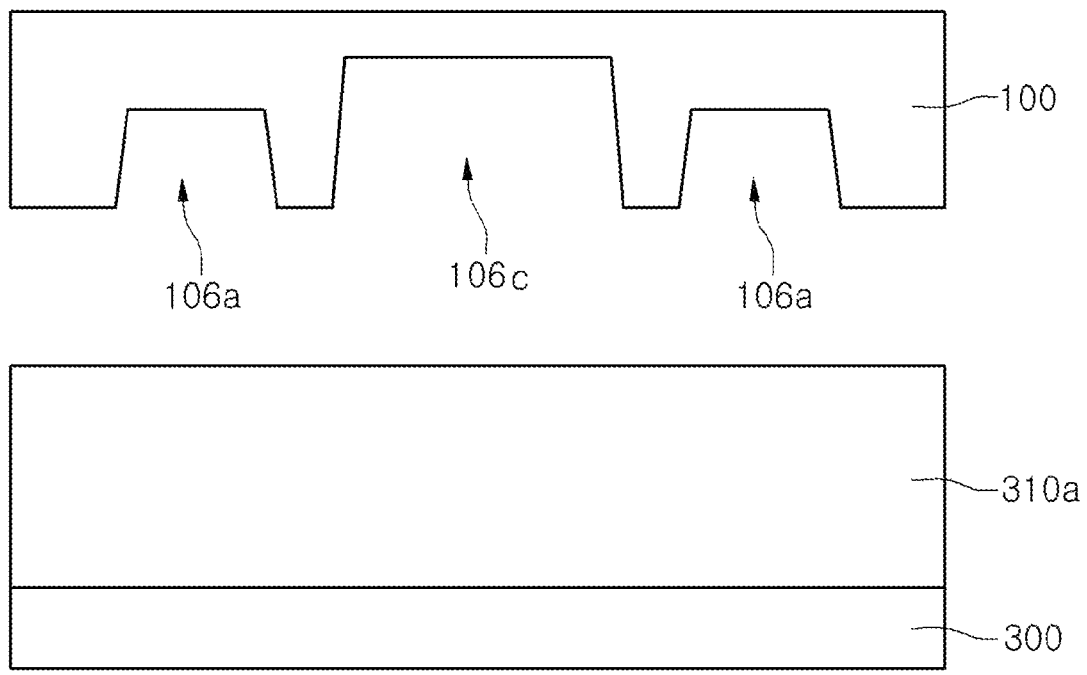
FIGS. 4A through 4C are cross-sectional views sequentially illustrating a method of forming a pattern using an imprint mold according to an embodiment of the present disclosure.
Figure 4B:
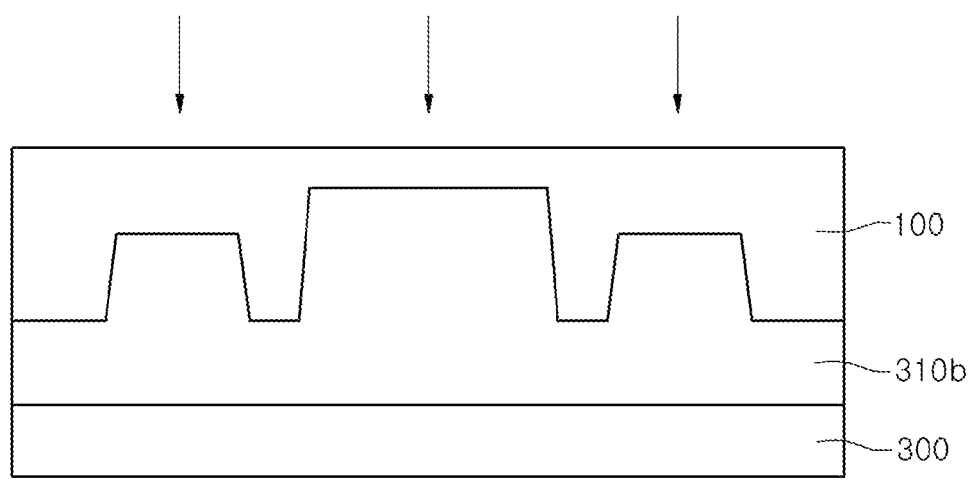
Figure 4C:
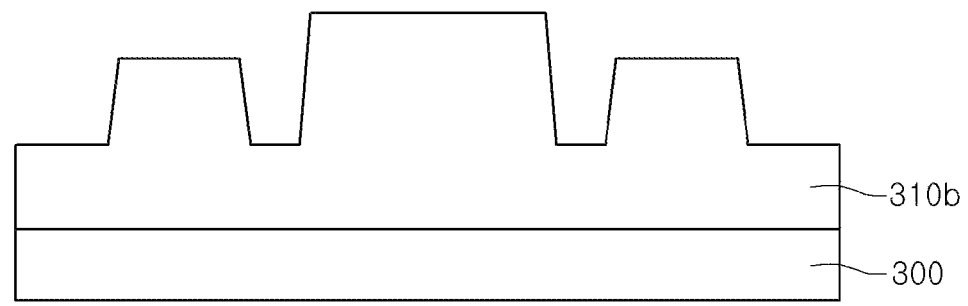

FIGS. 4A through 4C are cross-sectional views sequentially illustrating a method of forming a pattern using an imprint mold according to an embodiment of the present disclosure.

As shown in FIG. 4A, an imprint mold 100 with second and third intaglio patterns 106c and 106a of second and first depths B and A, which is fabricated through the fabrication process of the first embodiment as described above, is prepared. The imprint mold 100 is aligned above a substrate 300 coated with a resin film 310a.

The imprint mold 100 with the third and second intaglio patterns 106c and 106a of the first and second depths A and B contacts and presses the resin film 310a, thereby transcribing the second and third intaglio patterns 106c and 106a onto the resin film 310a, as shown in FIG. 4B. The resin film 310a, onto which the intaglio patterns 106c and 106a of the imprint mold 100 are transcribed, is hardened. As a result, a resin film 310b with a pattern of the multi-layer structure is formed. In order to harden the resin film 310a, it is preferable to irradiate UV (ultra violet) rays on the resin film 310a via the imprint mold 200.

Subsequently, the imprint mold 100 is separated from the resin film 310b provided with the pattern of multi-layer structure, as shown in FIG. 4C. At this time, the pattern formation process is completed.

In these ways, an imprint mold with a fine pattern of multi-layer structure can be provided through the imprint mold fabrication methods according to embodiments of the present disclosure. As such, a fine pattern of multi-layer structure for the LCD device can be formed using only a single imprint mold. Therefore, the fine pattern formation method according to an embodiment of the present disclosure can reduce the number of fabricating processes and the fabricating costs, in comparison with the related art method forming a fine pattern of multi-layer structure using several imprint molds with patterns of single layer structure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating an imprint mold comprising:
    forming a metal film on a substrate;
    forming first and second photo resist patterns on the metal film;
    etching the metal film and the substrate using the first and second photo resist patterns to form first and second metal patterns and a first pattern;
    removing the second photo resist pattern and the second metal pattern to form third metal pattern; and
    etching the substrate using the first photo resist pattern and third metal pattern as an etch mask to form a second pattern derived from the substrate and a third pattern derived from the first pattern,
    wherein the etching processes using the first and second photo resist patterns are performed in the wet etching method, and
    wherein the second metal pattern is formed to a narrower width than that of the first metal pattern,
    wherein the first and second metal pattern are simultaneously etched through the wet etching process, the second metal pattern is entirely removed and a part of the first metal pattern remains, the remained portion of the first metal pattern is used as a third metal pattern.

2. The method claimed as claim 1, wherein the second pattern is formed to have a first depth and the third pattern is formed to have a deeper depth than that of the first pattern.

3. The method claimed as claim 1, wherein the second photo resist pattern is formed to a narrower width than that of the first photo resist pattern.

4. The method claimed as claim 1, wherein the removal of the second photo resist pattern and second metal pattern is performed by a wet etching process.

* * * * *